United States Patent [19]

Wakamatsu et al.

[11] Patent Number: 5,216,373
[45] Date of Patent: Jun. 1, 1993

[54] CIRCUIT ELEMENT MEASURING APPARATUS AND METHOD FOR MEASURING A PARAMETER OF A DUT INCLUDING A COMPENSATION NETWORK HAVING AN ADMITTANCE CHARACTERISTIC

[75] Inventors: Hideki Wakamatsu; Shinya Goto, both of Hachiojishi, Japan

[73] Assignee: Hewlett-Packard Company, Palo Alto, Calif.

[21] Appl. No.: 952,466

[22] Filed: Sep. 28, 1992

Related U.S. Application Data

[63] Continuation of Ser. No. 653,700, Feb. 11, 1991, abandoned.

[30] Foreign Application Priority Data

Feb. 21, 1990 [JP] Japan .................................. 2-40559

[51] Int. Cl.$^5$ ............................................ G01R 27/00
[52] U.S. Cl. ................................. 324/720; 324/649; 324/691
[58] Field of Search ............... 324/601, 649, 650, 658, 324/684, 691, 713, 715, 720

[56] References Cited

U.S. PATENT DOCUMENTS 5,014,012 5/1991 Kuboyama et al. ............... 324/720

FOREIGN PATENT DOCUMENTS 0217459 1/1990 Japan .

OTHER PUBLICATIONS

Kohichi Maeda et al "Multi-Frequency LCR Meters Test Components Under Realistic Conditions" Hewlett-Packard Journal, pp. 24-31, Feb. 1979.
Yoh Narimatsu et al "A Versatile Low Frequency Impedance Analyzer with an Integral Tracking Gain--Phase Meter" Hewlett-Packard Journal pp. 22-28, Sep., 1981.

Primary Examiner—Gerard R. Strecker
Assistant Examiner—Diep Do

[57] ABSTRACT

A circuit element measuring apparatus for measuring a parameter of a device under test (DUT) includes a signal source, a voltmeter, a zero detection amplifier, and a compensation network all of which are coupled to the DUT by four shielded lines. The compensation network is also coupled to a range resistance. The compensation network provides two independent sets of correction data. One is based on the length of the shielded line and the other is based on the range resistance used. The parameter being measured can then be adjusted by the appropriate set of correction data to provide a more accurate measurement. A method of operating the circuit element measuring apparatus for measuring the parameter of the DUT by generating the two sets of correction data and adjusting the parameter accordingly.

9 Claims, 6 Drawing Sheets

CIRCUIT ELEMENT MEASURING APPARATUS AND METHOD FOR MEASURING A PARAMETER OF A DUT INCLUDING A COMPENSATION NETWORK HAVING AN ADMITTANCE CHARACTERISTIC

This is a continuation of application Ser. No. 653,700, filed Feb. 11, 1991, and now abandoned.

FIELD OF THE INVENTION

The present invention relates to a method and apparatus for high accuracy circuit element measurements by easily correcting changes, if any, in the measurement cables or range resistance.

BACKGROUND OF THE INVENTION

Demands for high-precision measurements of a circuit element are increasing annually. The apparatus for such measurements is exemplified by the "Multi-Frequency LCR meter 4274A or 4275A" which is commercially available from Yokogawa-Hewlett-Packard for use in four-terminal measurements. FIG. 1 is a schematic circuit diagram showing a circuit element measuring apparatus for four-terminal pair measurements according to the prior art.

By means of four terminal lines $CL_1$, $CL_2$, $CL_3$, and $CL_4$ providing four terminal pairs, a circuit element to be measured (hereinafter referred to as a "DUT" or element $Z_x$) is connected to a signal source SS, a volt meter VM, range resistance $R_r$ and zero detection amplifier A which together form a measuring apparatus. The impedance value of the element $Z_x$ shall also be referred to as $Z_x$.

The lines $CL_1$, $CL_2$, $CL_3$ and $CL_4$ are generally made of coaxial cables although not limited thereto, and their outer conductor terminals $g_{11}$, $g_{21}$, $g_{31}$ and $g_{41}$ at one end thereof are connected to one another and held at the same potential. The terminals $l_{11}$ and $l_{21}$ of the center conductor of the lines $CL_1$ and $CL_2$ at the same end thereof are connected to one terminal of the element $Z_x$. The terminals $l_{31}$ and $l_{41}$ of $CL_3$ and $CL_4$ are connected to the other terminal of the element $Z_x$. The terminals of the center conductors of the lines $CL_1$, $CL_2$, $CL_3$ and $CL_4$ and the outer conductor at the opposite end (i.e. at the side on the meter) are respectively designated as $l_{12}$, $g_{12}$, $l_{22}$, $g_{22}$, $l_{32}$, $g_{32}$, $l_{42}$ and $g_{42}$.

Between the terminals $l_{12}$ and $g_{12}$, the signal source SS and a signal source resistance $R_s$ are connected in series. The volt meter VM is connected between the terminals $l_{22}$ and $g_{22}$. The terminals $l_{22}$ and $g_{32}$ are respectively connected to the inverted input terminal and non-inverted input terminal of the zero detection amplifier A. The feedback resistance $R_f$ is connected between the inverted input terminal and the output terminal of the zero detection amplifier A. The output of the zero detection amplifier A is introduced into a narrow-band amplification/phase compensation amplifier NBA. The output of the NBA is applied through the range resistance $R_r$ to the terminal $l_{42}$. The NBA is similar to that used in the aforementioned meters 4272A and 4275A. The range resistance $R_r$ is placed between the terminal $l_{42}$ and the NBA output, and the terminals $g_{42}$ and $g_{32}$ are also connected.

In the circuit of FIG. 1, an automatic control is performed on the voltage between the terminals $l_{32}$ and $g_{32}$, i.e., controlled such that the current flow through the terminal $l_{32}$ may be substantially zero. As a result, a voltage $V_x$ to be applied to the element $Z_x$ is obtained as the indication of the volt meter VM. Moreover, a current $I_x$ to flow through the element $Z_x$ is obtained as an indication of the range resistance $R_x$. Since a complex voltage and a complex current are measured at the volt meter VM and the range resistance $R_r$ with reference to the detected output of the signal source SS, the value $Z_x$ is determined in a complex value in accordance with the following equation:

$$Z_x = V_x/I_x = V_x R_r/V_i \qquad (0)$$

wherein $V_i$ is equal to the voltage generated across the $R_r$ and is expressed as $$V_i = I_x R_r.$$

In the above-equation, the term $V_x/V_i$ is calculated by a well known vector voltage measuring circuit (referred to as "VRD") which is incorporated in the aforementioned meters 4274A and 4275A. The calibrations are accomplished by the well known method of shorting and opening elements lo (or by using a known third impedance) to replace the elements to be measured. However, due to a host of inaccuracies in the apparatus, the accurate value as expressed by the Equation (0) cannot always be obtained.

Specifically, the voltage $V_v$ measured by the volt meter VM is different from the voltage $V_x$ applied to the DUT. The voltage $V_i$ across the range resistor $R_x$ is also different from the product of the current $I_x$ through the DUT and the resistance $R_r$. Moreover, the values $V_x$ and $V_v$ and the values $I_x$ and $V_i$ are respectively proportional to individual coefficients which are a function of angular frequency $\omega$, so that they can be expressed as follows:

$$V_x = H(\omega) V_v \qquad (1);$$

and $$I_x = Y(\omega) V_i \qquad (2).$$

Hence, the impedance $Z_x$ of the DUT is expressed, as follows:

$$\begin{aligned} Z_x &= V_x/I_x \qquad (3) \\ &= (H(\omega))/(Y(\omega))(V_v/V_i), \\ &= Z_c(\omega)(V_v/V_i) \end{aligned}$$

wherein $Z_c(\omega) = H(\omega)/Y(\omega)$. \qquad (3-1)

The vector ratio of $V_v/V_i$ can be accurately measured by the VRD. A known standard $Z_r$ is measured in advance in place of an unknown DUT, and the $Z_c(\omega)$ is calculated as a correction data from the measured vector ratio $(V_v/V_i)$ and the value $Z_R$. The calculated value of $Z_c(\omega)$ is stored in the apparatus. Thus, when the impedance $Z_x$ of an unknown DUT is to be measured, the vector ratio $(V_v/V_i)$ is measured and multiplied by the correction data $Z_c(\omega)$.

Incidentally, in order to measure the DUT remotely or in combination with another apparatus, the impedance measuring apparatus should be able to use various cable lengths l. In order to obtain the impedance of the DUT with an optimal signal to noise or S/N ratio, a plurality of range resistors $R_r$ may be used.

From the standpoint of the S/N ratio, it is necessary to use the $Z_R$ having a value suited for the range resistance $R_r$. It is also necessary to change the standard apparatus for each range resistance $R_r$ when the correction data $Z_c(\omega)$ is to be obtained. However, $Z_c(\omega)$ is a function of cable length l and range resistor $R_r$. Therefore, it is generally necessary to measure and store the correction data $Z_c(\omega)$ for all conceivable combinations of the value $R_r$ and l.

One conceivable solution is to determine the data $Z_c(\omega)$ from separable and independent functions of the cable length l and the range resistance $R_r$. The concept that the data $Z_c(\omega)$ is determine for separable and independent functions of the cable length l and the range resistor $R_r$ means that the value $Z_c(\omega)$ can be expressed in the form of the product of a function $z1(l)$ of l and a function $z2(R_r)$, of $R_r$ by the following Equation:

$$Z_c(l, R_r, \omega) = z1(l, \omega) z2(R_r, \omega) \quad (4)$$

The circuit measuring apparatus satisfying the above-specified definition has the following advantages:

(a) If the following three values are known for the cable lengths $l_1$ and $l_2$ and the range resistances $R_r1$ and $R_r2$, the correction data $Z_c(\omega)$ need not be measured for all combinations of l and $R_r$:

$Z_c(l_1, R_r1, \omega)$;

$Z_c(l_1, R_r2, \omega)$;

and $Z_c(l_2, R_r1, \omega)$,

Other correction data can be calculated in the following form:

$$\begin{aligned} Z_c(l_2, R_r2, \omega) &= z1(l_2, \omega) z2(R_r, \omega) \\ &= z_c(l_1, R_r2, \omega) \cdot \\ & \quad z_c(l_2, R_r1, \omega)/ \\ & \quad z_c(l_1, R_r1, \omega) \end{aligned} \quad (5)$$

In other words, the combination of the correction data to be measured is reduced as follows:
from (the number of l)×(the number of $R_r$) when the value $Z_c$ is not separable;
to (the number of l)+(the number of $R_r$)−1, when the value $Z_c$ is separable. As a result, the time for measuring the correction data is substantially reduced.

(b) After the correction data have been measured for one cable length l and all the range resistances $R_r$, a correction data is measured for a new cable length. In this case, the correction data is measured for only one range resistance $R_r$, and can be calculated from the Equation (5) for the remaining range resistance, as described in the advantage (a). In other words, the measurement of the correction data $Z_c(\omega)$ for a new cable length may be only once by using one standard apparatus even if the range resistance $R_r$ is varied. Generally speaking, the reference resistance $R_R$ is used in the reference apparatus $Z_R$. This means that the correction data can be easily calculated even when an arbitrary cable length l is used.

In order to achieve the advantages heretofore described, there may be several methods of making the $Z_c(\omega)$ separable. The circuit shown in FIG. 1 satisfies the separation of the value $Z_c(\omega)$ At point A in FIG. 1, the potential is substantially zero for a low measuring frequency signal. However, when the frequency is high, the potential at point $A_p$ in FIG. 1 is not substantially zero. In an extreme case, the potential at $A_p$ may become equal to the potential at $B_p$ in FIG. 1 as the measuring frequency or the measuring cable length l greatly increases. Whether or not the point $A_p$ reaches such a voltage depends upon the relation between the measuring cable length l and the wave length of the measurement frequency. That is, a different voltage is measured with a different cable length l even if the frequency remains the same. Assuming the separation of $Z_c(\omega)$, the correctness of the calculated value depends upon the CMRR (i.e., Common Mode Rejection Ratio) of the differential amplifier for detecting the value $V_i$. The accuracy of $Z_c(\omega)$ corresponds to a value substantially equal to the CMRR in the worst case. For example, this means a differential amplifier capable of a CMRR of 40 dB or more for 30 MHz for a circuit element measuring apparatus so that the correction data satisfies the separation of the values l and $R_r$ within an accuracy of 1% for 30 MHz. Since it is difficult to manufacture an amplifier having such an excellent CMRR, the correction data $Z_c(\omega)$ must be measured for all the combinations of the cable length l and the range resistance $R_r$ and $Z_c(\omega)$ is not independent.

SUMMARY OF THE INVENTION

It is an object of this invention to provide a circuit element measuring apparatus and method capable of a high degree of accuracy.

It is a further object of this invention to provide a circuit element measuring apparatus and method which minimizes the need for storing correction data.

In accordance with these objects, the characteristics of a circuit element or device under test (DUT) is accurately measured through the use of a compensation network.

In one preferred embodiment, four pairs of cables are connected to the DUT on one end, and the other ends are connected to a signal source, a volt meter, a zero detection amplifier and the compensation network.

In one particularly preferred embodiment, the compensation network comprises a transformer. A winding of the transformer is connected to a detection resistance while another winding of the transformer is connected to the zero detection amplifier. In yet another embodiment, the windings of the transformer are constructed from the core and sheath of a coaxial line.

DETAILED DESCRIPTION OF THE PREFERRED EMBODIMENT

Figure 1:
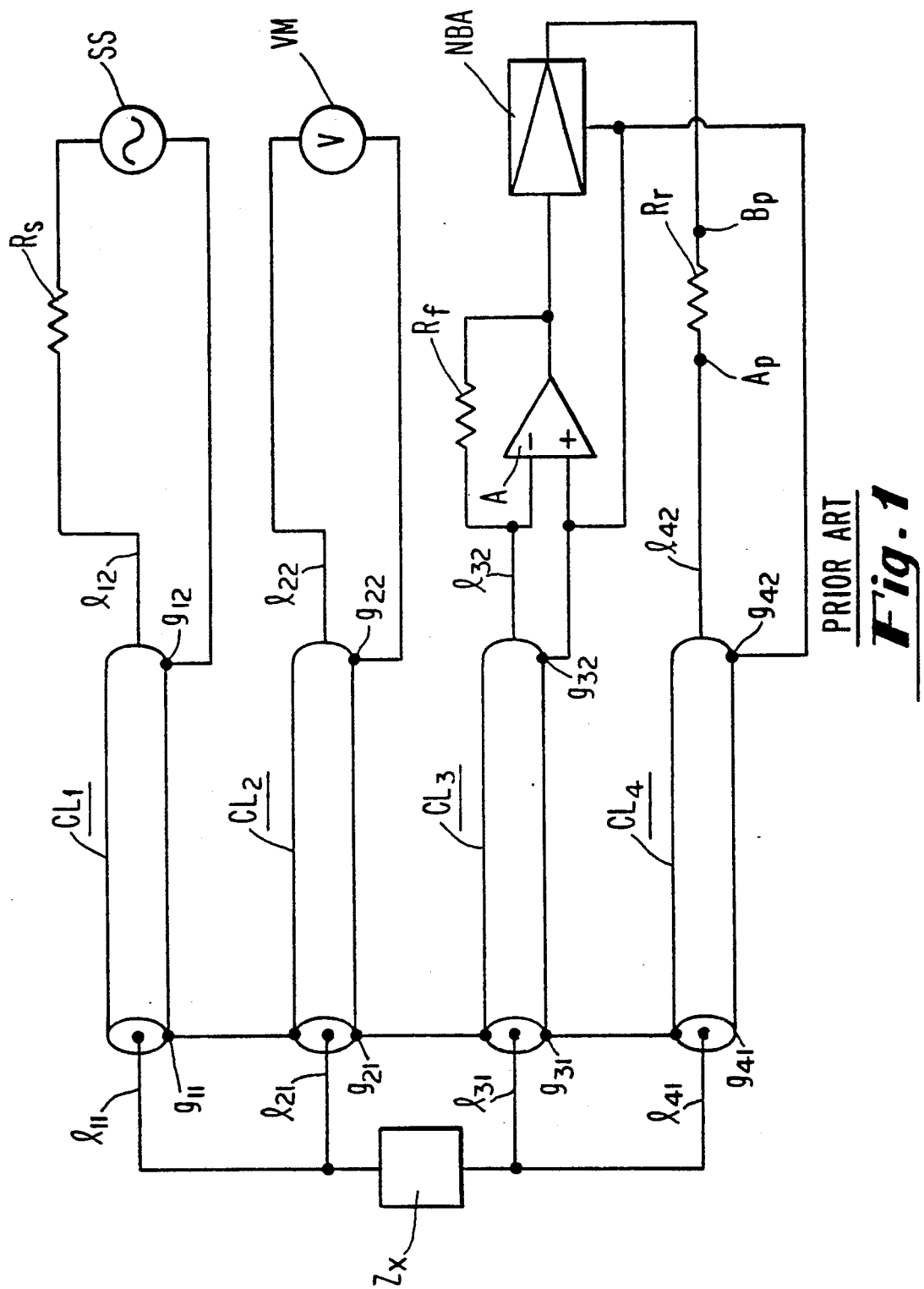
FIG. 1 is a schematic diagram of the circuit element measuring apparatus according to the prior art.
Figure 2:
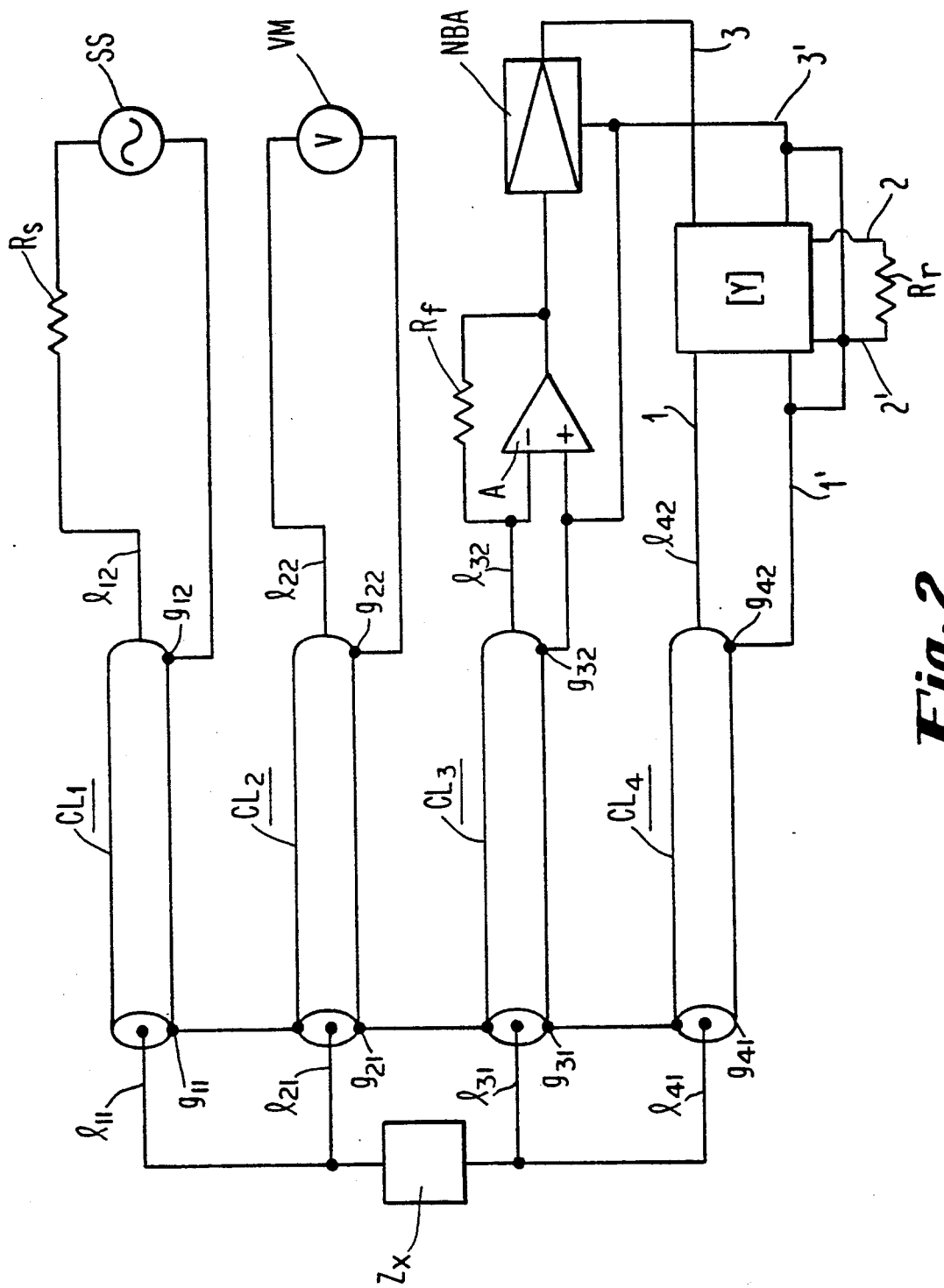
FIG. 2 is a schematic diagram of the circuit element measuring apparatus according to one embodiment of the present invention.

In the circuit element measuring apparatus of FIG. 2, a compensation network [Y] having two-terminal pair ports 1-1', 2-2' and 3-3' is employed in accordance with this invention. The port 1-1' of the compensation network is connected to the terminals $l_{42}$ and $g_{42}$; the port 2-2' of the compensation network is connected to the range resistance $R_r$; and the port 3-3' of the compensation network is connected to the output of the NBA.

If the input currents to the ports 1-1', 2-2' and 3-3' are respectively designated as $i_1$, $i_2$ and $i_3$, and if the voltages at the ports 1-1', 2-2' and 3-3' are respectively designated as $v_1$, $v_2$ and $v_3$, the following Equation holds:

$$\begin{bmatrix} i_1 \\ i_2 \\ i_3 \end{bmatrix} = \begin{bmatrix} y_{11} & y_{12} & y_{13} \\ y_{21} & y_{22} & y_{23} \\ y_{31} & y_{32} & y_{33} \end{bmatrix} \begin{bmatrix} v_1 \\ v_2 \\ v_3 \end{bmatrix} \quad (6)$$

wherein the network [Y] has the following Y matrix $$[Y] = \begin{bmatrix} y_{11} & y_{12} & y_{13} \\ y_{21} & y_{22} & y_{23} \\ y_{31} & y_{32} & y_{33} \end{bmatrix}$$

Moreover, the following two Equations hold:

$$i_1 = -Y_1 v_1 \quad (7)$$

and $$i_2 = -Y_2 v_2 \quad (8)$$

wherein;

$Y_1$ is the admittance looking from the port 1-1' to the outside; and $Y_2$ is the admittance looking from the port 2-2' to the outside.

From the Equations (6) through (8), the following Equations hold:

$$\begin{bmatrix} 0 \\ 0 \\ i_3 \end{bmatrix} = \begin{bmatrix} y_{11}+Y_1 & y_{12} & y_{13} \\ y_{21} & y_{22}+Y_2 & y_{23} \\ y_{31} & y_{32} & y_{33} \end{bmatrix} \begin{bmatrix} v_1 \\ v_2 \\ v_3 \end{bmatrix} \quad (9)$$

and $$\frac{V_2}{v_1} = \frac{\begin{vmatrix} y_{11}+Y_1 & 0 & y_{13} \\ y_{21} & 0 & y_{23} \\ y_{31} & i_3 & y_{33} \end{vmatrix}}{\begin{vmatrix} 0 & y_{12} & y_{13} \\ 0 & y_{22}+Y_2 & y_{23} \\ i_3 & y_{32} & y_{33} \end{vmatrix}} \quad (10)$$

$$= \frac{y_{21}Y_{13} - y_{23}(y_{11}+Y_1)}{-y_{12}y_{13} - y_{13}(y_{22}+Y_2)}$$

If, moreover the relations between $v_1$ and $I_x$ and between $v_2$ and $v_i$ can be expressed by:

$$I_x = f \cdot v_1 \text{ (f is a function of l)} \quad (11);$$

and $$v_i = g \cdot v_2 \text{ (g is a function of } R_r\text{)} \quad (12);$$

the following Equation can be obtained from the Equations (10) through (12):

$$\frac{v_i}{I_x} = \frac{g \cdot [y_{21}y_{13} - y_{23}(y_{11}+Y_1)]}{f \cdot [y_{12}y_{23} - y_{13}(y_{22}+Y_2)]} \quad (13)$$

If $Z_1$ and $Z_2$ are expressed by the following equations, the former is the function of l only, and the latter is the function of $R_r$ only:

$$Z_1 = \frac{y_{21}y_{13} - y_{23}(y_{11}+Y_1)}{f} \quad (14)$$

and $$Z_2 = \frac{g}{y_{12}y_{23} - y_{13}(y_{22}+Y_2)} \quad (15)$$

If the equations (13), (14) and (15) are substituted into the Equation (2), the following Equation is obtained $$1/y(\omega) = V_i/I_x = X_1(l,\omega) Z_2(R_r,\omega) \quad (16)$$

Since, moreover, $H(\omega)$ is not the function of the range resistance $R_r$, the following equation is obtained if the Equation (16) is substituted into the Equation (3-1):

$$Z_c(\omega) = H(l,\omega) Z_1(l,\omega) Z_2(R_r,\omega) \quad (17)$$
$$= Z_1'(l,\omega) Z_2(R_r,\omega)$$

wherein $$Z_1'(l,\omega) = H(l,\omega) Z_1(l,\omega). \quad (17-1)$$

Since the relations of the Equations (11) and (12) are generally satisfied in the measuring state, the Equation (17-1) always holds at the measuring state.

Figure 3:
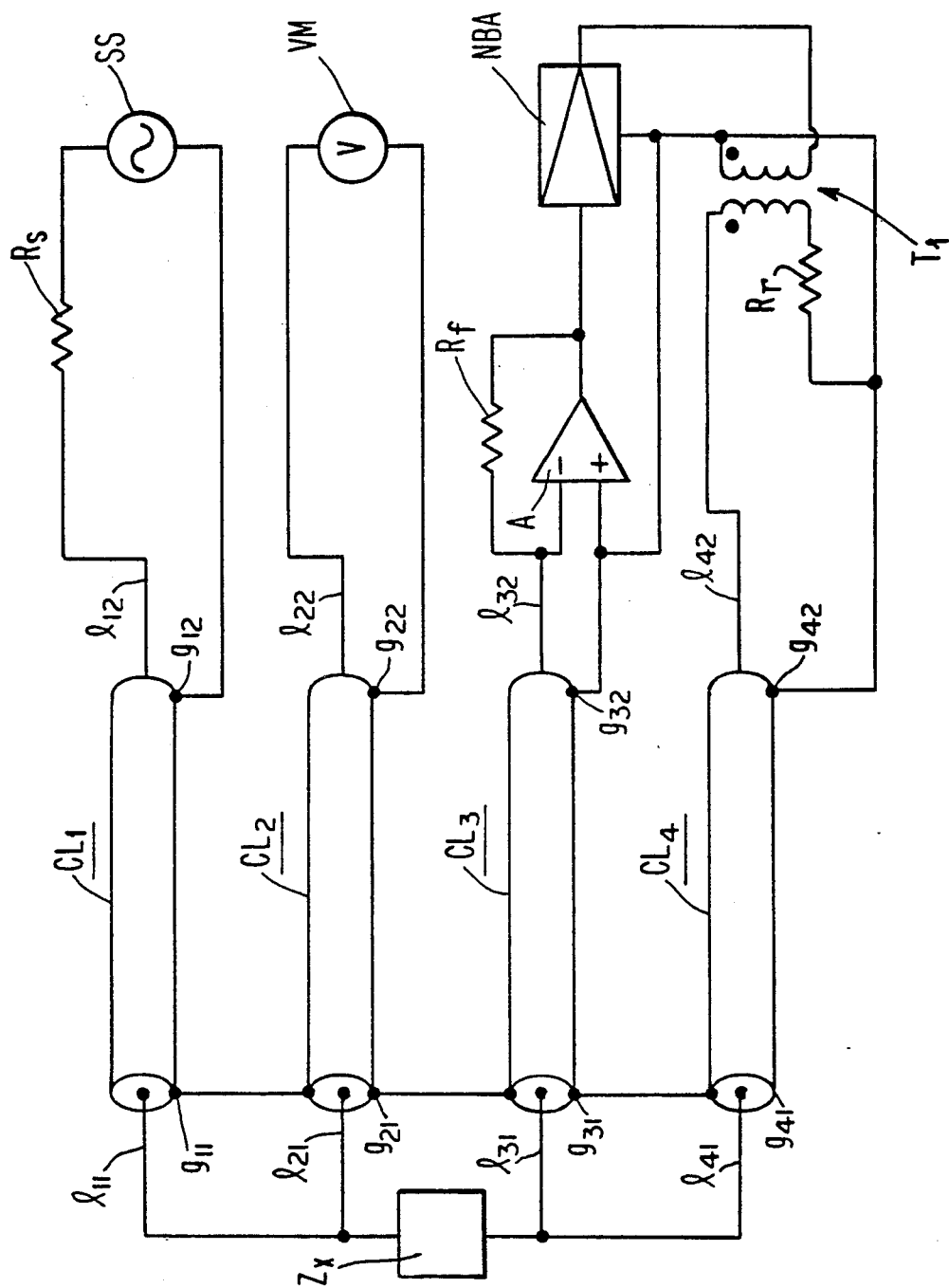
FIG. 3 is a schematic diagram of the circuit element measuring apparatus according to one embodiment of the present invention.

FIG. 3 shows an embodiment in which the compensation network [Y] comprises a transformer $T_1$. The range resistance $R_r$ has one terminal grounded to the earth, and the other terminal connected to the terminal $l_{42}$ through one winding of the transformer $T_1$. The other winding of the transformer $T_1$ is connected between the output of the NBA and the earth. The polarity of the winding of the transformer $T_1$ is so selected according to the NBA polarity that the circuit element measuring apparatus may correctly operate.

The circuit in FIG. 2 is comparable to the circuit in FIG. 3 since the range resistance $R_r$ is interchangeable with one winding of the transformer $T_1$ in FIG. 3. Different shields surrounding the transformer $T_1$ and the range resistance $R_r$ may make the $Z_c(\omega)$ more independent.

Figure 4:
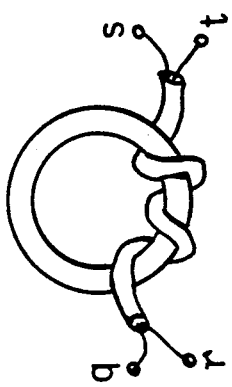
FIG. 4 is a diagram showing one embodiment of the transformer $T_1$ of FIG. 3.

In one preferred embodiment of this invention, the transformer $T_1$ has excellent high-frequency characteristics which can be implemented by winding a coaxial line on the magnetic core as shown in FIG. 4 such that the first and second windings of the transformer are the core and sheath of a coaxial line. Since the range resistance $R_r$ has one terminal grounded to the earth, the differential amplifier is not necessary for detecting the voltage $v_i$.

Figure 5:
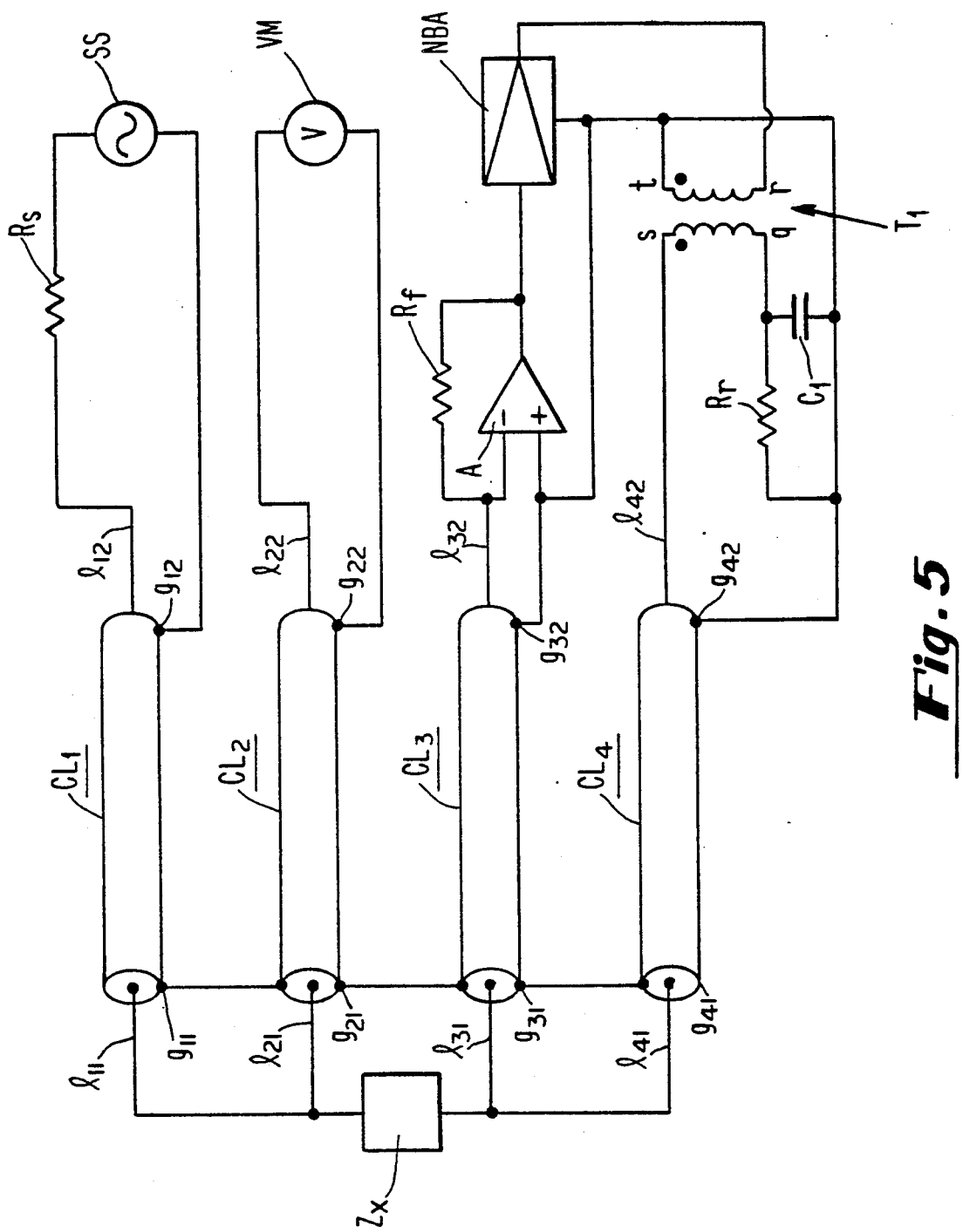
FIG. 5, is a schematic diagram showing the case in which the circuit element measuring apparatus of FIG. 3 includes the winding capacity $C_1$ of the transformer $T_1$.

FIG. 5 shows the case in which the transformer $T_1$ has a winding capacitance $C_1$. As the frequency increases, the measurement value at the point q in FIG. 5 becomes more susceptible to the influences of the winding capacitance $C_1$ on the stability of the measurement value. Since the point q is located at one terminal of the winding of the transformer, it is difficult to eliminate the influence of the capacitance $C_1$ of the transformer. The capacitance of $C_1$ in FIG. 5 can, however, be reduced to substantially zero by using the transformer $T_1$ having the structure shown in FIG. 4. Therefore, the structure using the coaxial line is preferred even though the transformer $T_1$ can be implemented in various ways.

Figure 6:
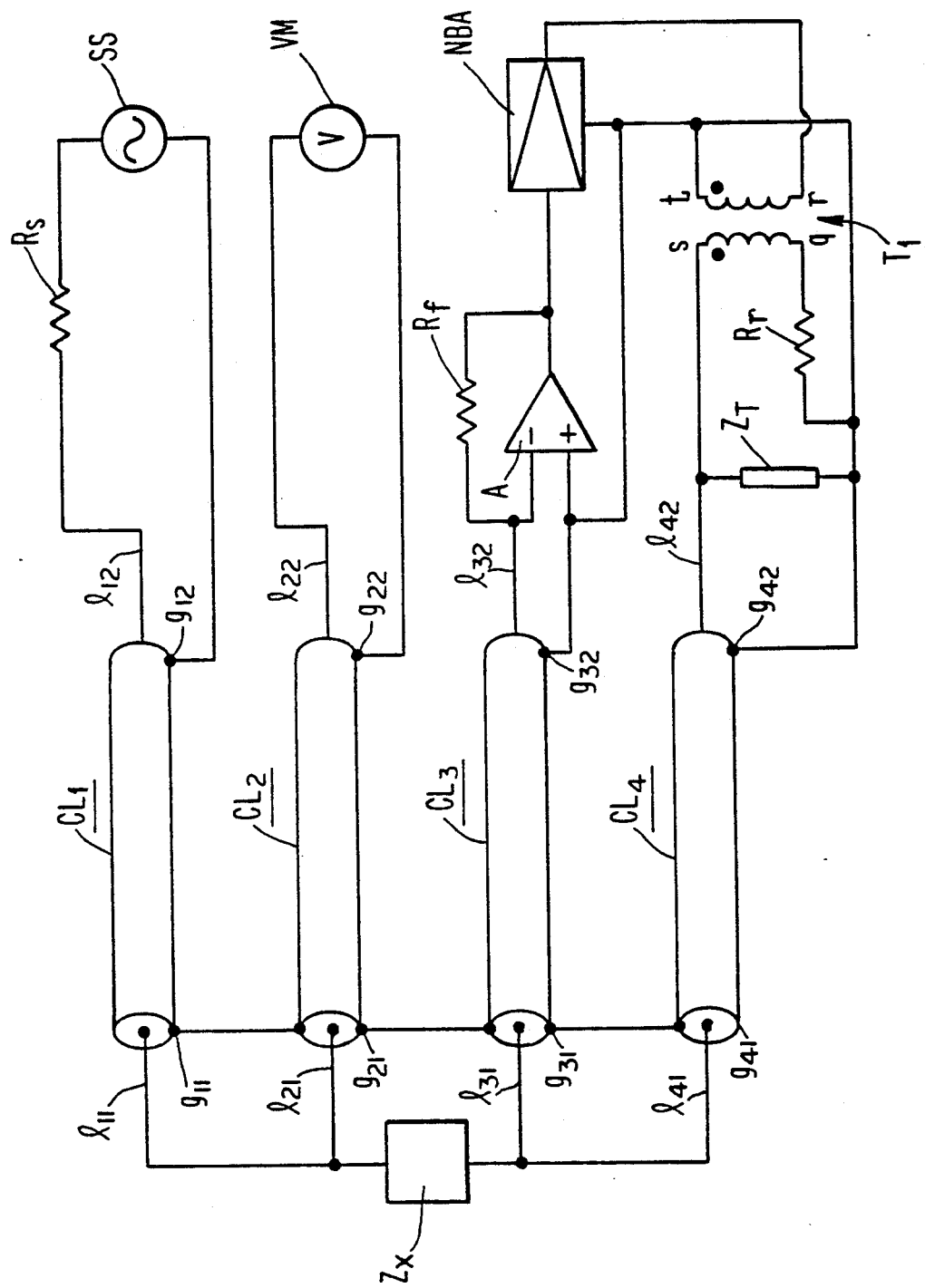
FIG. 6 is a schematic diagram showing the case in which the matching circuit $Z_T$ is added to the circuit element measuring apparatus of FIG. 3.

FIG. 6 shows an equivalent circuit when the present invention is practiced with the matching circuit $Z_T$ which is disclosed in Japanese Patent Application Nos. Sho 63-167061 and Hei 01-131050. Under this arrangement, a remote element measurement can be also performed with a high frequency signal without deteriorating the separation of $Z_c(\omega)$.

Figure 7:
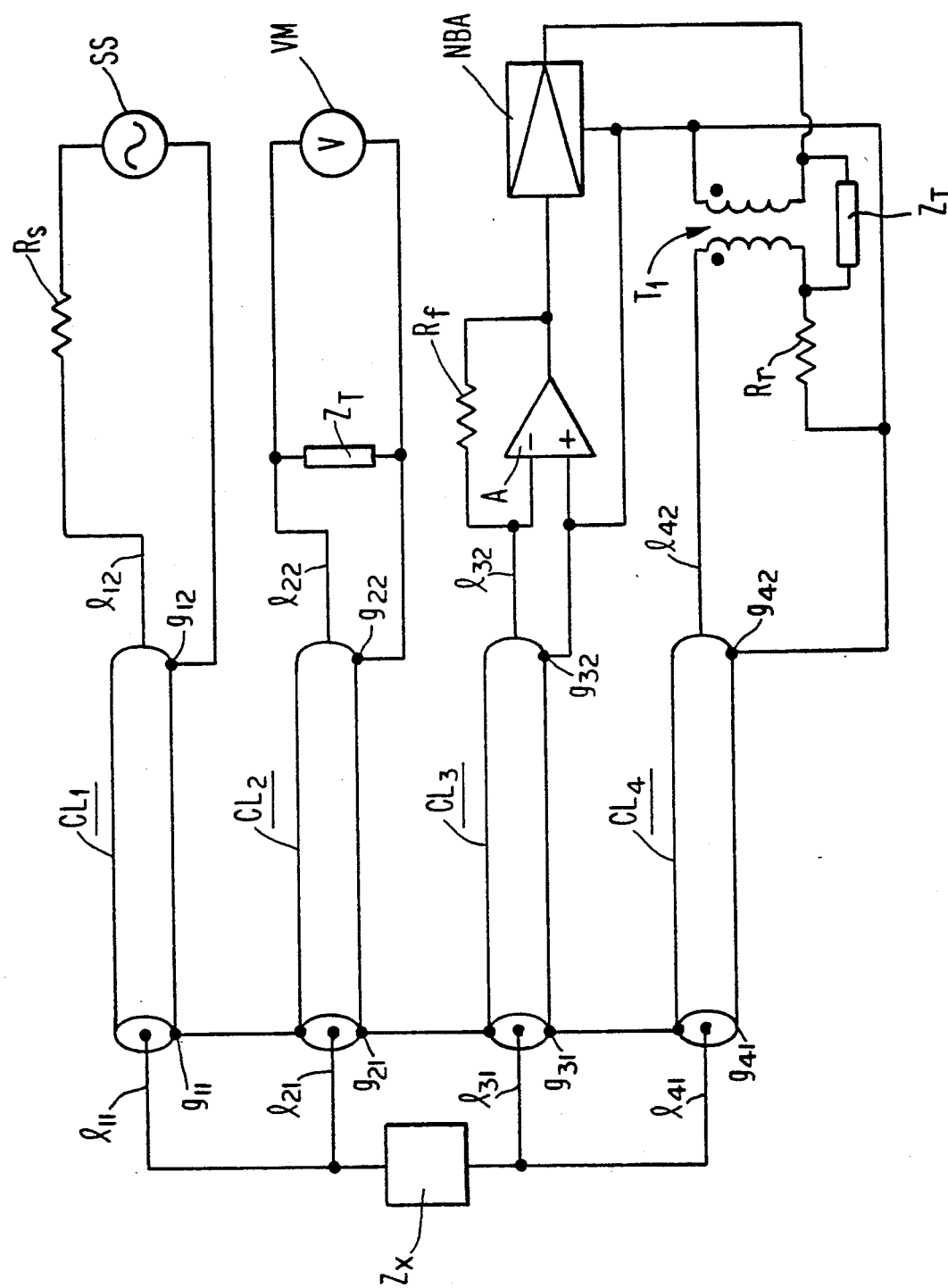
FIG. 7 is a diagram showing the case in which the transformer $T_1$ of the circuit element measuring apparatus of FIG. 6 has a winding ratio of 1:1.

FIG. 7 shows that the winding ratio of the transformer $T_1$ of FIG. 6 is 1:1. Since similar results are obtained, regardless of whether the matching circuit $Z_T$ might be between the points s and t or the points q and r when the winding ratio of the transformer $T_1$ is 1:1, a more complete matching can be obtained by using the winding of the transformer $T_1$ as the line of the characteristic impedance $Z_r$. As a result, the detecting characteristics of the $I_x$ are widened.

According to the practice of the present invention, the unbalanced circuit can obtain substantially accurate measurements of the high frequency voltage/current signal applied to the DUT. Inaccuracies might otherwise be caused by the common mode rejection ratio accompanying the differential detection. Although correction data $Z_c(\omega)$ is a function of the function of the cable length l and the function of the range resistor $R_r$, calibration is obtained by the reduced number of the stored correction data $Z_c(\omega)$ because of the separation. More specifically, in the prior art the number of the correction data to be stored is (the number of the cable length l)×(the number of the range resistors $R_r$). In accordance with the practice of the present invention, correction data stored is reduced to (the number of the cable length l)+(the number of the range resistors $R_r$)−1.

In the embodiment of the present invention with the coaxial cable wound on the magnetic core, the matching o of the circuits can be accomplished, and the influence of the winding capacitance of the transformer can be substantially reduced to widen the range without any deterioration of the aforementioned separation.

We claim:

1. A circuit element measuring apparatus for measuring a parameter of a DUT having one terminal and another terminal, said apparatus comprising:
    a signal source for generating a measurement voltage;
    a volt meter for detecting said measurement voltage;
    a zero detection amplifier;
    a compensation network and a range resistance coupled thereto, said network having an admittance characteristic;
    a first shielded line having one end connected to said one terminal of said DUT and another end of said first line connected to a signal source for applying said measurement voltage signal to said one terminal;
    a second shielded line having one end connected to said one terminal of said DUT terminal and the other end of said second line connected to said volt meter for detecting said measurement voltage; and
    a third shielded line having one end connected to the other terminal of said DUT and the other end of said third lien connected to said zero detection amplifier for detecting the voltage at said other terminal;
    a fourth lien having one end connected to the other terminal of said DUT terminal and the other end of said fourth line connected to said range resistance and said compensation network for reducing the voltage at the other terminal of said DUT in response to the output of said zero detection amplifier; and
    said compensation network being coupled to said fourth line and said range resistor so that a first and second set of correction data related to an impedance of the apparatus can be generated, the first set being dependent upon the length of the fourth line and substantially independent of the resistance of the range resistor and the second set being dependent on the resistance of the range resistor and substantially independent of the length of the fourth line, said parameter being adjusted by the correction data.

2. Apparatus according to claim 1 wherein the compensation network includes a transformer comprising:
    a fist winding having one end connected to said fourth line and the other end connected to said detection resistor; and
    a second winding connected to the output of said zero detection amplifier.

3. Apparatus according to claim 2 wherein said first and second windings are the core and sheath of a coaxial line.

4. Apparatus according to claim 3 wherein said volt meter has its input terminating at the characteristic impedance of said second line, the characteristic impedance of said coaxial line is substantially equal to that of said fourth line, and the other terminal of said DUT connected to said range resistance terminates in the characteristic impedance of said fourth line.

5. Apparatus according to claim 1 wherein said range resistance includes one terminal connected to ground.

6. A circuit element measuring apparatus for measuring a parameter of a device under test comprising:
    means for applying a measurement voltage to one terminal of said device;

means for detecting the measurement voltage applied to said one terminal of said device;

zero detection amplifier means coupled to the other terminal of said device for detecting the voltage at said other terminal;

range resistance coupled to said other terminal of said device and said zero detection amplifier;

shielded line means coupling said device, said means for applying a measurement voltage, said means for detecting the measurement voltage, said zero detection amplifier, and said range resistance;

compensation means having an admittance characteristic and being coupled to said range resistance, said zero detection amplifier, and said other terminal of said device for reducing the voltage at said other terminal in response to the output of said zero detection amplifier; and said compensation means and said range resistance being coupled to said other terminal by one shielded line means having a known length so that a first and second set of correction data related to an impedance of the apparatus can be generated, the firs set being dependent upon the length of the one shielded line means and substantially independent of the resistance of the range resistance, the second set being dependent upon the resistance of the range resistor and substantially independent of the length of the one shielded line means, said parameter being adjusted by the correction data.

7. Apparatus according to claim 6 wherein said compensation network comprises a transformer.

8. A method of operating a circuit element measuring apparatus for measuring a parameter of a device under test having one terminal and another terminal comprising a source of a measurement voltage, means for detecting the measurement voltage, a zero detector amplifier, a range resistance, a compensation network having an admittance characteristic and shielded lines, coupled thereto said method comprising the following steps:

applying a measurement voltage from said source to said one terminal;

detecting the measurement voltage applied to said one terminal by said means for detecting the measurement voltage;

detecting the voltage at said other terminal with said zero detection amplifier;

coupling the output of the zero detection amplifier and voltage at said other terminal to said range resistance and said compensation network such that said compensation network tends to reduce the voltage of the other terminal in response to the output of sad zero detection amplifier;

generating a first and second set of correction data related to an impedance of said apparatus, said first set being dependent on a length of at lest one of the shielded lines and substantially independent of the resistance of the range resistance, the second set being dependent on the resistance of the range resistance and substantially independent of the length of at least one shielded line;

measuring said parameter of the device under test based on a ratio of said detected voltages; and adjusting said parameter using said correction data.

9. The method of claim 8 including the step of grounding said range resistance.

* * * * *